US006730197B2

(12) United States Patent
Wang et al.

(10) Patent No.: US 6,730,197 B2
(45) Date of Patent: May 4, 2004

(54) OBLIQUE DEPOSITION APPARATUS

(75) Inventors: Jian-Ping Wang, Singapore (SG); Jianzhong Shi, Singapore (SG)

(73) Assignee: Data Storage Institute, Singapore (SG)

( * ) Notice: Subject to any disclaimer, the term of this patent is extended or adjusted under 35 U.S.C. 154(b) by 0 days.

(21) Appl. No.: 10/099,701

(22) Filed: Mar. 14, 2002

(65) Prior Publication Data

US 2003/0019745 A1 Jan. 30, 2003

(30) Foreign Application Priority Data

Jul. 25, 2001 (SG) ..................... 200104507-9

(51) Int. Cl.[7] ................ C23C 14/34; C23C 16/00; B05C 11/11
(52) U.S. Cl. ................ 204/298.11; 118/504; 118/720
(58) Field of Search .............. 204/298.11; 118/504, 118/720

(56) References Cited

U.S. PATENT DOCUMENTS

| | | | | |
|---|---|---|---|---|
| 5,544,771 A | * | 8/1996 | Lee et al. ................ 216/2 |
| 5,597,462 A | * | 1/1997 | Cho ................ 204/298.11 |
| 5,785,763 A | * | 7/1998 | Onda et al. ............ 118/723 EB |
| 5,885,425 A | * | 3/1999 | Hsieh et al. ............ 204/192.12 |

OTHER PUBLICATIONS

Smith, Donald O., "Anisotropy in Permalloy Films", Journal of Applied Physics, 1959, pp. 264S–265S.
Knorr, T. G. et al. "Dependence of Geometric Magnetic Anisotropy in Thin Iron Films", Physical Review, vol. 113, No. 4, Feb. 15, 1959, pp. 1039–1046.
Smith, D.O. et al. "Oblique–Incidence Anisotrophy in Evaporated Permalloy Films", Journal of Applied Physics, vol. 31, No. 10, Oct, 1960, pp. 1755–1762.
Hara, K. et al. "Magnetic and Optical Anisotrophy Depth Profiles in Obliquely Deposited Iron and Cobalt Films", Journal of Magnetism and Magnetic Materials 116, 1992, pp. 441–448.

* cited by examiner

*Primary Examiner*—Steven Versteeg
(74) *Attorney, Agent, or Firm*—Jenkens & Gilchrist, P.C.

(57) ABSTRACT

An oblique sputtering deposition apparatus is provided for preparing a thin film. A collimator having angled passages for filtering out particles from stray directions is placed between the substrate and the incident particle flux. The angle of the passages can be adjusted from about 0 to about 90° with respect to the substrate normal according to requirements. The oblique incidence of particle flux brings forms a column structure which is also angled.

11 Claims, 7 Drawing Sheets

OBLIQUE DEPOSITION APPARATUS

BACKGROUND OF THE INVENTION

1. Field of the Invention

The present invention relates to depositing films, and more particularly to an apparatus for preparing thin films by an oblique collimator deposition.

2. Description of the Prior Art

Sputtering is a commonly used method for thin film deposition. Sputtering is performed by providing ionized atoms, such as $Ar^+$, in a vacuum which accelerate towards and bombard a negatively-charged target material. The ionized atoms knock off other atoms and molecules from the target material. These ejected atoms and molecules subsequently deposit on a pre-selected substrate also disposed in the vacuum chamber, thus forming a film on a surface of the substrate.

The trajectory of the ejected atoms and molecules depends in significant part on the incident angle of the bombarding ions and the scattering of ejected atoms and molecules as they collide with other particles. The trajectory follows a well-known cosine (or Gaussian) distribution. Therefore, the atoms and molecules directed towards the substrate surface come from various angles, and only a comparatively small portion are incident substantially perpendicular to the substrate surface. As a result, it is difficult for sputtering to achieve a deep conformal coverage within high aspect ratio steps or contacts on semiconductor wafer substrate.

To overcome this drawback, a device known as a collimator is used. A collimator, such as is diagrammatically represented in FIG. 1A with reference numeral 12, is placed between a target 10 and a substrate 15. Substrate 15 is generally bonded or clamped on a substrate holder 14. The chamber housing 16 is evacuated with a pump assembly (not shown). Collimator 12 typically comprises a disk-shaped object having a plurality of holes or openings 20 provided therethrough. The collimator functions effectively as a filter, allowing only the atoms and molecules 13 incident perpendicular to the substrate 15 to pass through and coat the substrate 15. This results in a more conformal deposition within deep contacts than when a collimator is not used.

FIG. 1B is a detail of the collimator 12 from the deposition system as shown in FIG. 1A. The collimator 12 can be described by its aspect ratio H/D, where H is the depth of the collimator and D is the diameter of the holes. FIG. 1C is a plan view of the collimator 12, which consists of a plurality of holes or openings 20 (only several holes are shown).

However, the collimator, like everything else within a sputtering chamber, gets coated with the sputtering material. The accumulation of sputtering material effectively diminishes the diametric size of the openings, thus reducing the deposition rate on the substrate. Eventually the amount of material able to pass through the openings may become unsatisfactory. Fortunately, there are techniques available, such as described in U.S. Pat. No. 5,409,587 to Sandhu, et al., to remove the accumulated materials and clean the collimator so that the sputtering can continue in a desired manner and deposition rate.

Existing techniques involving a collimator are effective in making the incident flux perpendicular to the substrate surface, but no such technique is available to make the incident flux oblique to the substrate surface (i.e. an oblique sputtering deposition).

Actually, an oblique evaporation deposition technique was reported as early as in 1959 by Smith [D. O. Smith, J. Appl. Phys. 30, 264(1959)] and Knorr et al. [T. G. Knorr and R. W. Hoffman, Phys. Rev. 113, 1039(1959)] in 1959. The formation mechanism, micro-structure, texture, and anisotropy of the films evaporated at oblique incidence have been investigated by Smith et al [D. O. Smith et al., J. Appl. Phys. 31, 1355(1960)]. Hara et al. have studied the magnetic and optical anisotropy in obliquely rf sputtered iron and cobalt films [K. Hara et al., J. NIMM 116,441(1992)]. They found the magnetic anisotropy in iron film mostly originates from the shape anisotropy of crystallites, and that in cobalt film mostly originate from the magnetocrystalline anisotropy. At present, oblique evaporation deposition has found several applications, such as metal recording tape.

Oblique evaporation deposition is easier to achieve than oblique sputtering deposition. This is because oblique evaporation deposition is performed under a high or ultra-high vacuum, and subsequently the directions of the evaporated particles can be controlled due to the large mean free path. In other words, there is less scattering because the mean free path is large. Oblique sputtering deposition is generally carried out under $10^{-3}$ Torr vacuum, a lower vacuum than evaporation deposition, and accordingly the directions of the sputtered particles are hard to control because of the smaller mean free path (i.e. more scattering). Because of this, oblique sputtering deposition is seldom reported. More so, there is no existing device for preparing thin films on a whole disk substrate to produce columns of film material angled in the circumferential direction or radial direction by using oblique sputtering deposition.

SUMMARY OF THE INVENTION

The exemplary embodiments of the present invention overcome the foregoing and other problems by providing a device for preparing thin films by oblique sputtering deposition by inserting an oblique collimator between the target and the substrate. The exemplary embodiments of the present invention also provide a device for preparing thin films by oblique deposition by inserting an oblique collimator between the incident source and the substrate. The oblique collimators described herein enable preparing thin films with an angled column structure and in some embodiments adjustable angle.

The present invention includes a device for depositing a film onto a surface of a substrate. The device can have a film material source for dispersing film material incident in the general direction of the substrate surface. The device can have a collimator between the film material source and the substrate. The collimator can have passages therein which are angled obliquely relative to the substrate surface such that incident film material traveling toward the substrate in a trajectory which is not substantially parallel to the oblique angle of the passages is blocked.

These and other objects and advantages of the device according to the present invention will become obvious to those of ordinary skill in the art after having read the following detailed description of the preferred embodiments which are illustrated in various drawing figures.

BRIEF DESCRIPTION OF THE DRAWINGS

A more complete understanding of the method and apparatus of the present invention may be obtained by reference to the following Detailed Description when taken in conjunction with the accompanying drawings wherein.

DETAILED DESCRIPTION OF THE PREFERRED EXEMPLARY EMBODIMENTS OF THE PRESENT INVENTION

Before the invention is described in detail, it should be understood that this invention is not limited to the exemplary embodiments depicted and described herein.

Figure 1A:
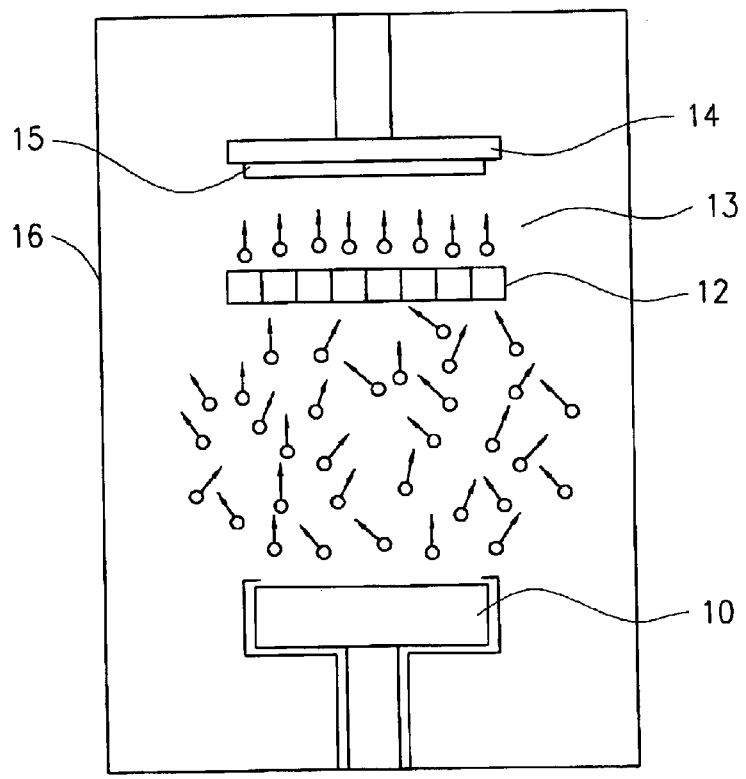
FIGS. 1A–C are schematic diagrams of a perpendicular collimator in use and in detail.
Figure 1B:
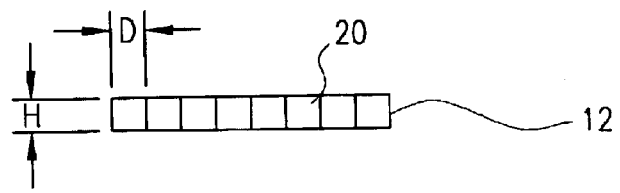
Figure 1C:
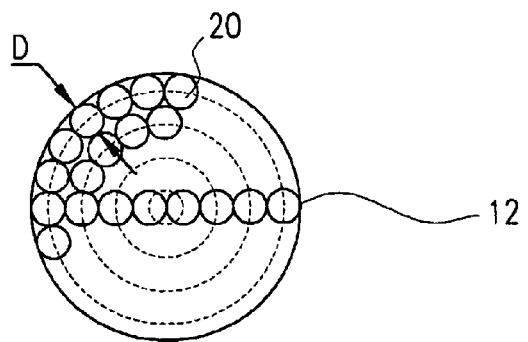
Figure 2A:
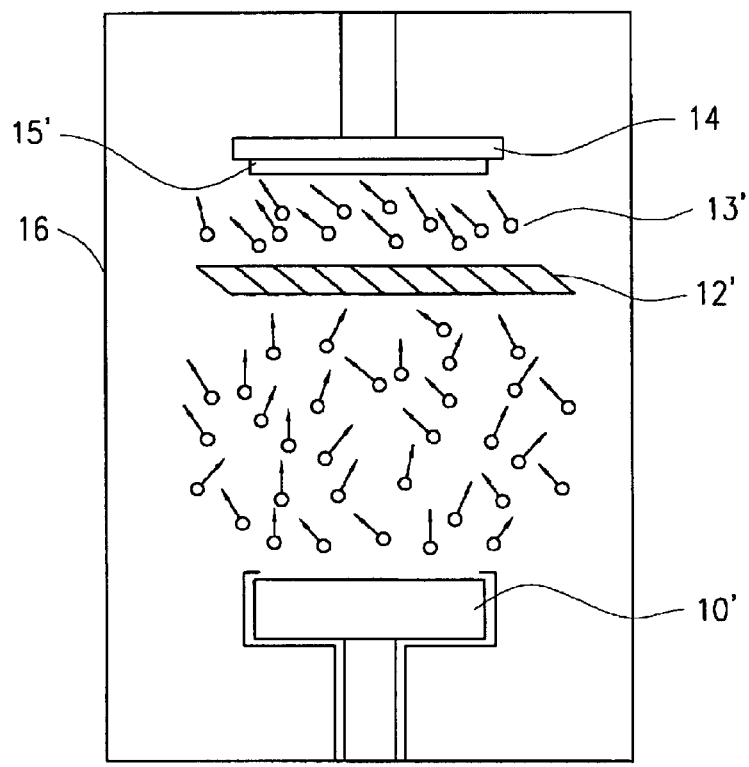
FIGS. 2A–C are schematic diagrams of a first embodiment of the device in accordance with the present invention in use and in detail.

A cross-sectional view of a first embodiment of the device in accordance with the present invention is illustrated in FIG. 2A. The difference between FIG. 1A and FIG. 2A is that in FIG. 2A an oblique collimator 12', rather than a perpendicular collimator, is shown. FIG. 2C is a 3-dimensional drawing of the collimator 12', which consists of supports 18' which span a plurality of rectangular sheets 17'. The collimator 12' can be constructed of metal or other conductor materials, insulate materials, or semiconductor materials. The number of the sheets 17' can be varied to achieve the desired passage size.

Figure 2B:
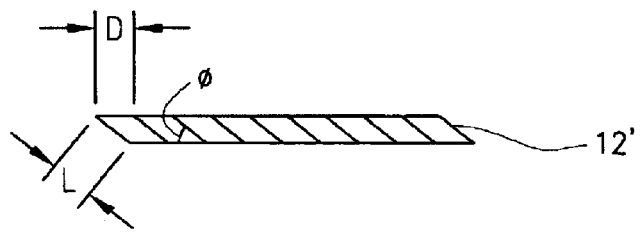
Figure 2C:
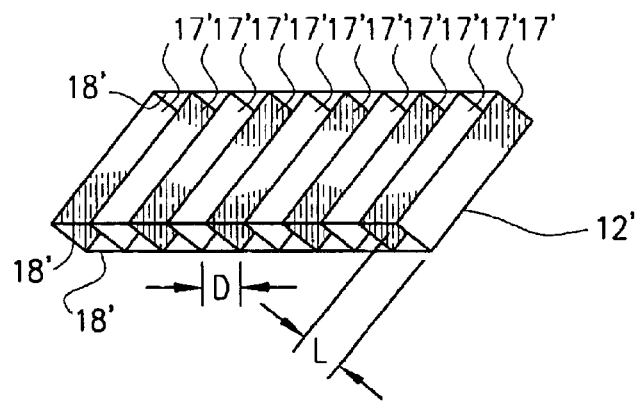

FIG. 2B is an end view of the collimator 12'. The collimator can be described by its aspect ratio D/L, and obliquing angle θ, where D is the distance between two neighboring sheets 17', L is the width of a sheet 17' (i.e. the depth of the collimator), and θ the angle between the sheet 17' and the support 18'. As shown in FIG. 2A, the angled collimator 12' is placed between the substrate 15' and target 10'. Only particles 13' with an oblique incident direction parallel to the sheet 17' can pass through the collimator 12' and finally deposit on the substrate 15'. Particles traveling in other directions are filtered by the collimator 12'. The deposited thin film will have an angled column structure which will be at the same angle as angle θ of the sheet 17'. This angled column structure results in a macro anisotropy of the properties of the film. It is often desirable that the aspect ratio be uniform throughout the collimator to ensure that the resulting deposited film will have a uniform thickness and uniform oblique structure.

Figure 3A:
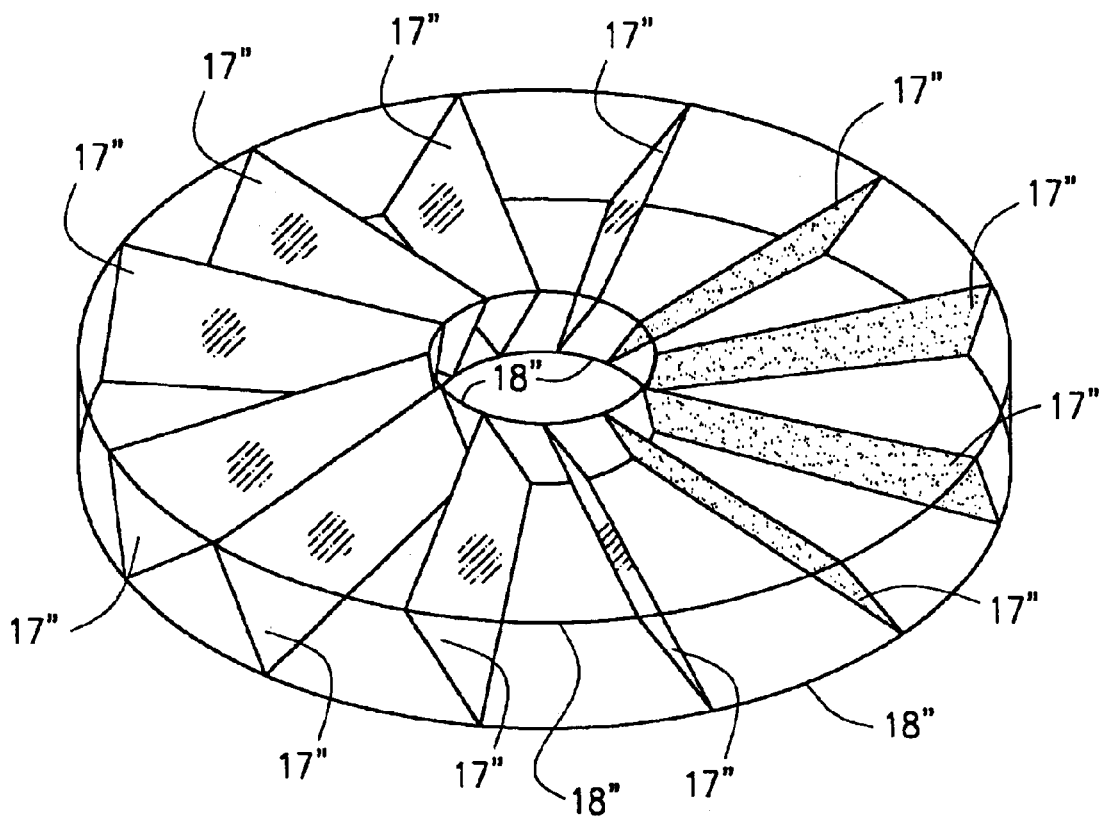
FIGS. 3A–B are a schematic diagram of a second embodiment of the device in accordance with the present invention.

A second embodiment of the oblique collimator is illustrated in FIG. 3A. The collimator is made of a circular-shaped support 18'' and a plurality of trapezoid-shaped sheets 17''. Sheets 17'' can be made of conductor, insulator or semiconductor materials. This circular-shaped collimator is specially designed for a disk-shaped substrate. The sheets 17'' are angled in the circumferential direction.

Figure 3B:
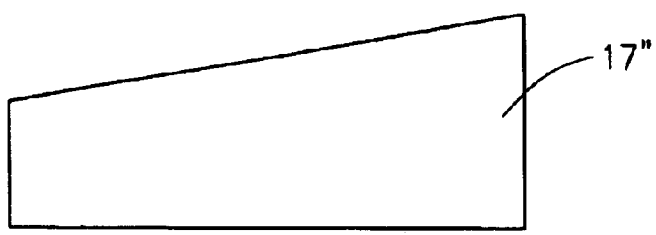
Figure 4:
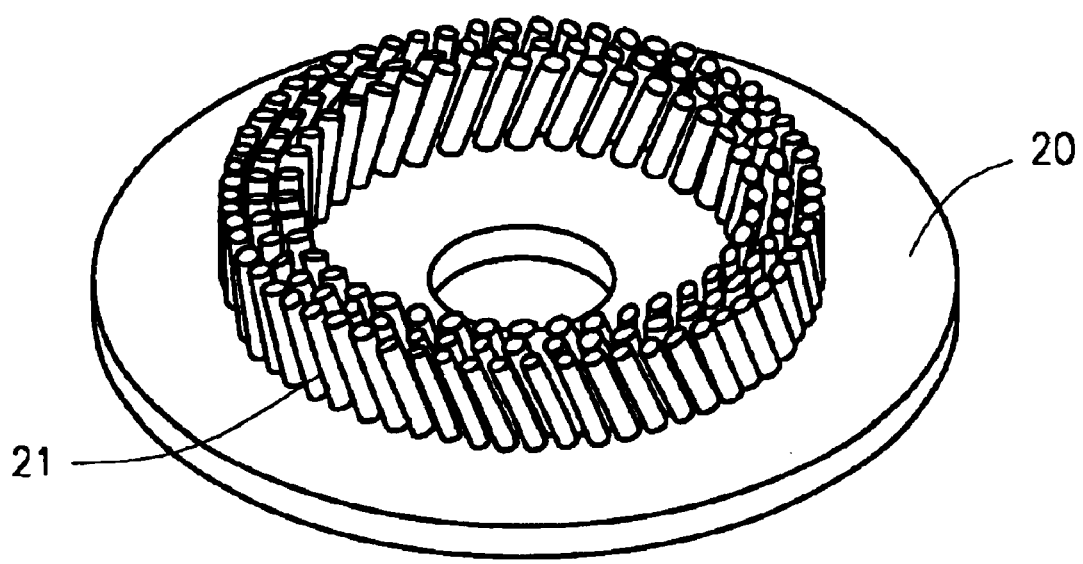
FIG. 4 is a schematic diagram of the column structure of a film on a circular-shaped substrate achieved by using an oblique collimator in accordance with the present invention.

FIG. 3B is a sheet 17'' having an increasing width toward its outer end which corresponds with the outer diameter of the collimator. This design ensures that the aspect ratio of the collimator is the same everywhere, and results in a desirable uniformity of thickness and uniform oblique effect. When this collimator is placed between a substrate and a target in a sputtering system similar to FIG. 2A, the resultant thin film on a disk substrate will have an angled column structure 21, as shown in FIG. 4. The columns angle in a circumferential direction with respect to the substrate surface of the disk substrate. This angled structure of the thin film is beneficial to hard-drive disk media since the angling of the anisotropy axis along the column causes an enhancement in effective magnetic head field, resulting in a desirable read/write performance of the media.

Figure 5:
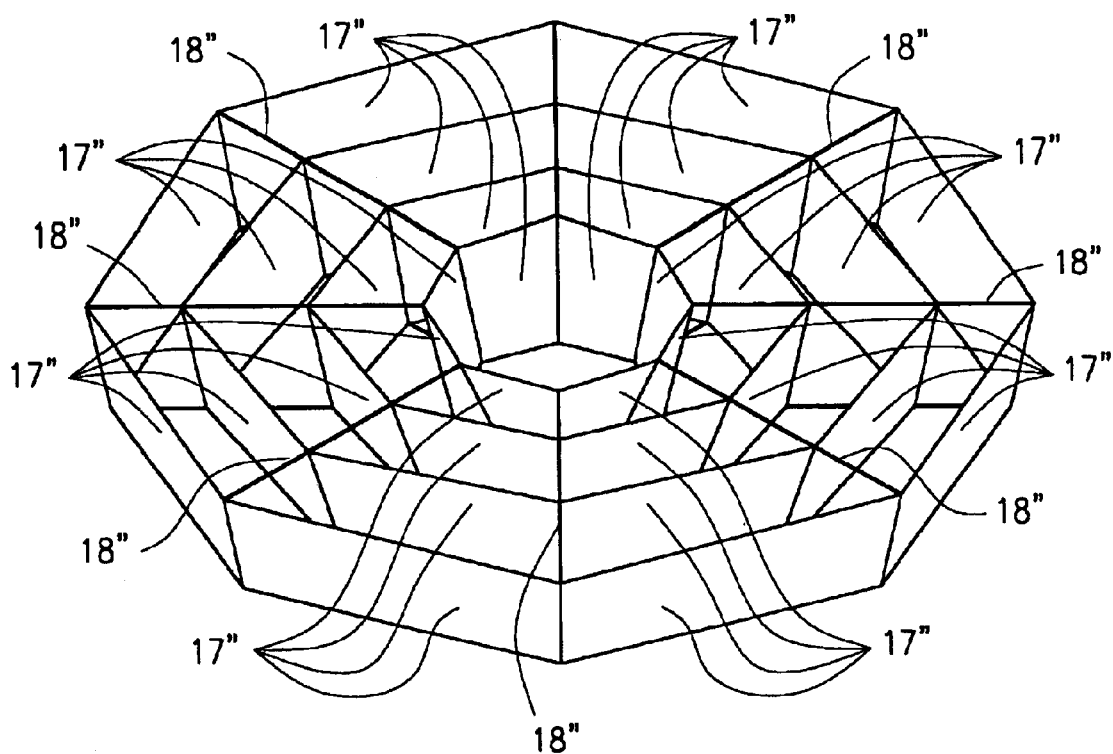
FIG. 5 is a schematic diagram of a third embodiment of the device in accordance with the present invention.

Furthermore, columns angling in the radial direction of the disk substrate can also be obtained by using another angled collimator as seen in FIG. 5. This collimator is constructed of a plurality of sheets 17'' angled in the radial direction rather than the circumferential direction.

In the above embodiments, the sheets 17' and 17'' can be fixed on the supports 18' and 18'', respectively. The angle with respect to the substrate surface of sheet 17' and 17'' can be adjusted from about 0 to about 90° by providing adjustment means, such as screws at the point or juncture between the sheets and structure. By providing adjustment means, the angle of the resulting thin film column can be correspondingly varied. One of ordinary skill in the art will appreciate that sheets 17' and 17'' need not necessarily be planar to provide the desired passages, but rather can be many other configurations, for example a plurality of tubular structures angled obliquely relative to the substrate surface.

Figure 6A:
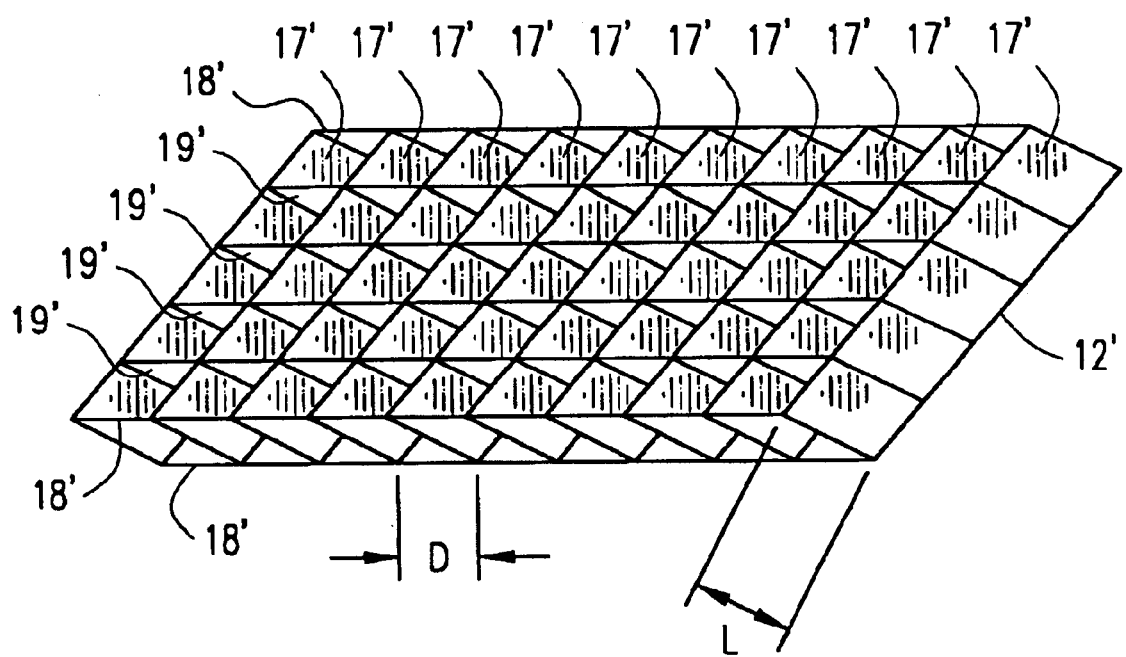
FIGS. 6A–B are a schematic diagrams of an enhanced collimator as depicted in FIGS. 2 and 3.
Figure 6B:
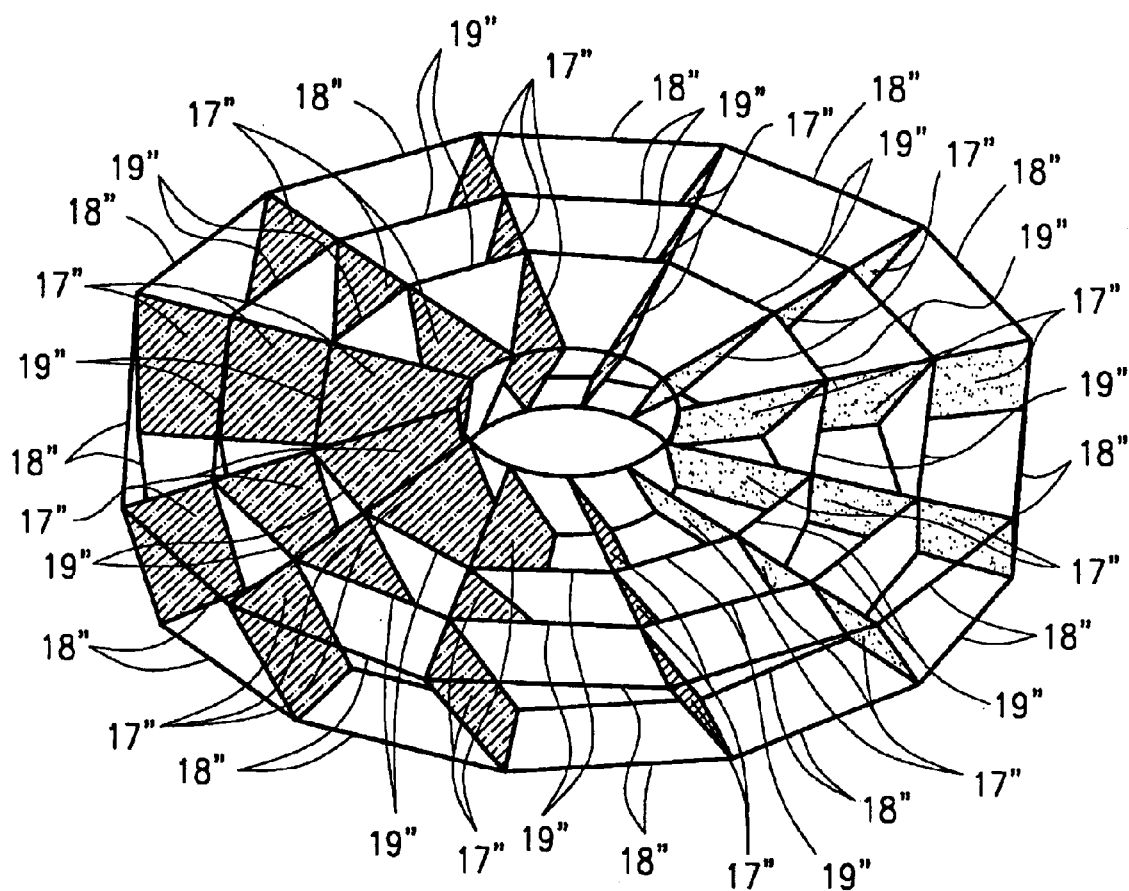

For collimators in the above embodiments according to this invention, the particles are "free" in the direction parallel to the sheet 17' or 17'' as they pass through the collimator. To further confine the particles in order to achieve a more collimated incident particle flux, additional sheets are can be provided. Referring to FIG. 6A, additional sheets 19' perpendicular to sheet 17' can be provided to a rectangular collimator. Similarly additional sheets 19'' can be provided to span sheets 17'' in a circular collimator as seen in FIG. 6B.

For all above embodiments, the oblique collimator is used in sputtering deposition. This oblique collimator can also be used in other thin film deposition technology resulting in oblique deposition by placing this oblique collimator between the substrate and incident flux of the film material. An example of another type of film deposition technology that the collimator of this invention can be used in is evaporative deposition, whereby the collimator would be placed between an evaporation medium and the substrate and the evaporation medium evaporated to disperse particles thereof incident towards the substrate.

Although the present invention has been described in terms of the presently preferred embodiments, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A device for depositing a film onto a surface of a substrate having a circular profile, comprising:

a film material source for dispersing film material incident in the general direction of the substrate surface;

at least one collimator between the film material source and the substrate, the at least one collimator having circularly spaced sheets establishing passages through said collimator, the passages being circular and angled in a radial direction relative to the circular profile of the substrate, wherein the passages are angled obliquely relative to the substrate surface such that incident film material traveling toward the substrate in a trajectory which is not substantially parallel to the oblique angle of the passages is blocked.

2. The device in accordance with claim 1, wherein a ratio of the height of the passages to the depth of the passages is substantially uniform throughout the collimator.

3. The device in accordance with claim 1, wherein the angle of the passages with respect to the substrate surface of the sheet of the collimator can be varied from about 0 to about 90°.

4. A The device in accordance with claim 1 wherein the film material source is a target constructed of the film material and particles are ejected from the target material by a sputtering technique.

5. The device in accordance with claim 1 wherein the film material source is an evaporation medium constructed of the film material and particles are dispersed from the evaporation medium in an evaporation technique.

6. The device in accordance with claim 1, wherein the collimator can be electrically floating, on earth or biasing.

7. The device in accordance with claim 1, wherein the collimator comprises a material selected from the group consisting of a conductor material, an insulator material, or a semiconductor material.

8. The device in accordance with claim 1 wherein the collimator comprises:
a support structure comprising a plurality of second sheets placed radially with respect to the center of the collimator, the plurality of second sheets being held in relative relation by the combination of the circularly spaced sheets and the second sheets, the combination forming passages there between.

9. A device for depositing a film onto a surface of a substrate having a circular profile, comprising:
a film material source for dispersing film material incident in the general direction of the substrate surface;
at least one collimator between the film material source and the substrate, the at least one collimator having radially spaced sheets establishing passages through said collimator, the sheets are angled obliquely relative to the substrate surface such that incident film material traveling toward the substrate in a trajectory which is not substantially parallel to the oblique angle of the sheets is blocked.

10. The device in accordance with claim 9, further comprising at least one substantially circular sheet being circular with respect to the radially spaced sheets, the substantially circular sheet being interposed with the radially spaced sheets forming passages therebetween.

11. The device in accordance with claim 10, wherein the at least one substantially circular sheet is angled obliquely relative to the substrate surface.

* * * * *